United States Patent
Kato et al.

(10) Patent No.: US 7,827,468 B2
(45) Date of Patent: Nov. 2, 2010

(54) MEMORY SYSTEM INCLUDING NONVOLATILE MEMORY AND VOLATILE MEMORY AND OPERATING METHOD OF SAME

(75) Inventors: Yoshiharu Kato, Kasugai (JP);
Yoshihiro Takemae, Kasugai (JP);
Toshio Ogawa, Kawasaki (JP);
Tetsuhiko Endoh, Kawasaki (JP);
Yoshinori Okajima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 1048 days.

(21) Appl. No.: 11/583,129

(22) Filed: Oct. 19, 2006

(65) Prior Publication Data

US 2007/0091678 A1 Apr. 26, 2007

(30) Foreign Application Priority Data

Oct. 20, 2005 (JP) .............................. 2005-305621

(51) Int. Cl.
*G11C 29/00* (2006.01)
(52) U.S. Cl. .................................. 714/763; 365/185.09
(58) Field of Classification Search ................. 714/763; 365/185.09
See application file for complete search history.

(56) References Cited

U.S. PATENT DOCUMENTS

| 5,640,349 | A | * | 6/1997 | Kakinuma et al. | ...... 365/185.33 |
| 7,143,332 | B1 | * | 11/2006 | Trimberger | .................. 714/763 |
| 7,216,284 | B2 | * | 5/2007 | Hsu et al. | .................... 714/766 |
| 7,263,649 | B2 | * | 8/2007 | Gan et al. | .................... 714/766 |
| 7,290,198 | B2 | * | 10/2007 | Tamura et al. | .............. 714/763 |
| 7,350,044 | B2 | * | 3/2008 | Keays | ......................... 711/165 |

FOREIGN PATENT DOCUMENTS

| JP | 63-181194 A | 7/1988 |
| JP | 05-299616 A | 11/1993 |
| JP | 2002-251884 A | 9/2002 |
| JP | 2002-328836 A | 11/2002 |

* cited by examiner

Primary Examiner—Esaw T Abraham
(74) Attorney, Agent, or Firm—Fujitsu Patent Center

(57) ABSTRACT

A volatile memory has a volatile additional area for storing an error correction code for a nonvolatile memory. Data stored in the nonvolatile memory are transferred to the volatile memory together with the error correction code without making an error correction. Thus, data transfer time from the nonvolatile memory to the volatile memory can be shortened. As a result, it is possible to shorten the time from beginning of the data transfer from the nonvolatile memory to the volatile memory to a point at which data becomes accessible.

20 Claims, 14 Drawing Sheets

MEMORY SYSTEM INCLUDING NONVOLATILE MEMORY AND VOLATILE MEMORY AND OPERATING METHOD OF SAME

CROSS REFERENCE TO RELATED APPLICATION

This application is based upon and claims the benefit of priority from Japanese Patent Application No. 2005-305621, filed on Oct. 20, 2005, the entire contents of which are incorporated herein by reference.

BACKGROUND OF THE INVENTION

1. Field of the Invention

The present invention relates to a memory system having a nonvolatile memory and a volatile memory, and an operating method of this memory system.

2. Description of the Related Art

Portable equipment such as a mobile phone, a digital camera, etc. has a volatile memory such as DRAM, etc. for temporarily holding data such as various kinds of parameters, etc. and a nonvolatile memory such as a flash memory, etc. for holding a program and data at a turning-off of a power supply. In general, in the flash memory of a NAND type, no data can be accessed at random, and access time is long. Therefore, when a program of MPU is stored in the flash memory of the NAND type, no MPU can smoothly execute the program. To solve this problem, a conventional memory system is formed of the flash memory and DRAM, and the program is transferred from the flash memory to DRAM at a turning-on of the power supply. MPU then reads the program from DRAM. For this case, there has been proposed a memory controller which executes data (program) transfer from the flash memory to DRAM without placing a load on MPU (e.g., Japanese Unexamined Patent Application Publication No. 2002-328836). This memory controller reads real data in the flash memory together with an error correction code, and corrects an error in the real data, and writes only the corrected real data to DRAM.

Further, there has been also proposed a technique for connecting data lines of the nonvolatile memory and the volatile memory to each other through a switch, and transferring data read out of one memory to another memory through the switch (e.g., Japanese Unexamined Patent Application Publication No. 63-181194). According to this technique, the nonvolatile memory does not have an area for storing the error correction code. Further, there has been proposed another technique for having an error correction circuit of the flash memory of the NAND type, a controller circuit and an interface circuit formed in the volatile memory (e.g.,Japanese Unexamined Patent Application Publication No. 2002-251884).

As mentioned above, for storing the program in the flash memory of the NAND type, it is necessary for MPU to read the program transferred from the flash memory to DRAM. In this case, MPU starts reading the program after the program is read from the flash memory, and all the error-corrected program is transferred to DRAM. Therefore, it takes much time from the start of the program transfer from the flash memory to DRAM to MPU's start of reading the program.

In particular, in a system in which the program is transferred from the flash memory to DRAM at a power-on, it takes a lot of time from the power-on to MPU's actual execution of the program. Specifically, it takes a long time for a user to operate a device after switching on the power supply of the device, deteriorating usability of the device.

On the other hand, when MPU starts reading the program before the transfer thereof to DRAM, there is a possibility that the execution of the program is stopped for a long time. Specifically, upon a read request for a program having not been transferred to DRAM, MPU must wait for a long time until this program is transferred to DRAM. The stoppage of the operation of MPU causes a problem in the system.

SUMMARY OF THE INVENTION

It is an object of the present invention to shorten the time from the beginning of data transfer to a point in time at which data becomes accessible in a memory system which stores data and the error correction code in the nonvolatile memory, and requiring data transfer from the nonvolatile memory to the volatile memory so as to access data in the volatile memory.

In one mode of the present invention, the nonvolatile memory has a nonvolatile data area for storing data and a nonvolatile additional area for storing an error correction code. The error correction code is used to correct an error in the data stored in the nonvolatile data area. The volatile memory has a volatile data area and a volatile additional area corresponding to the nonvolatile data area and the nonvolatile additional area, respectively. Namely, the volatile memory has the volatile additional area for storing the error correction code for the nonvolatile memory.

A memory controller reads the data and the error correction code from the nonvolatile data area and the nonvolatile additional area, and writes the read data and error correction code to the volatile data area and the volatile additional area, respectively. Data transfer time from the nonvolatile memory to the volatile memory can be shortened by transferring the data stored in the nonvolatile memory to the volatile memory together with the error correction code without making an error correction. Accordingly, it is possible to shorten the time from beginning of the data transfer from the nonvolatile memory to the volatile memory to a point at which the data becomes accessible.

On the contrary, for transferring data only from the nonvolatile memory to the volatile memory while correcting the error correction, data read from the volatile memory cannot be executed until all the data are written to the volatile memory. The time taken for writing all the data to the volatile memory tends to be long since it includes an error correction time for all the data. Therefore, in the prior art it takes a long time from the beginning of the data transfer to the volatile memory to a point in time at which the data within the volatile memory becomes accessible.

In a preferable example in one mode of the present invention, the memory controller generates a nonvolatile read-access signal for making read access to the nonvolatile memory, or a volatile write-access signal for making write access to the volatile memory. Thus, the data and the error correction code stored in the nonvolatile data area and the nonvolatile additional area are directly transferred to the volatile data area and the volatile additional area. For example, a data terminal of the nonvolatile memory and a data terminal of the volatile memory are connected to each other via a common data bus line. The transfer time for the data and the error correction code can be shortened by simultaneously executing a read operation to the nonvolatile memory and a write operation to the volatile memory. As a result, it is possible to further shorten the time from when the data transfer from the nonvolatile memory to the volatile memory data starts to when the data becomes accessible.

In a preferable example in one mode of the present invention, the memory controller starts the generation of the nonvolatile read-access signal or the volatile write-access signal in accordance with a power-on of the memory system. Since the data transfer time at the power-on is shortened, it is possible to shorten the time from the power-on to a start of the operation of the system in comparison with the prior art. As a result, usability of the system can be improved.

In a preferable example in one mode of the present invention, the error correction circuit corrects the data written to the volatile memory by using the error correction code after the data and the error correction code are written to the volatile memory. Namely, the error correction is executed not to data read from the nonvolatile memory but to data read from the volatile memory. There is a possibility that the data transferred to the volatile memory includes an error. However, an error in the data can be corrected by the error correction circuit at a time the data are required. As a result, it is possible to shorten the time from when the data transfer from the nonvolatile memory to the volatile memory starts to when the data becomes accessible.

In a preferable example in one mode of the present invention, a flag area has a flag corresponding to each storing position of data within the volatile data area. Each flag is set when a correcting operation is executed by the error correction circuit. The error correction circuit executes the error correction only to data corresponding to an unset flag. Preventing error-correction to error-corrected data makes it possible to reduce frequency of the error correction, thereby shortening a total time required for the error correction. As a result, data read efficiency of the system can be improved.

In a preferable example in one mode of the present invention, a volatile memory control circuit reads data and an error correction code from the volatile memory to correct an error in the data, and writes back to the volatile memory the data corrected by the error correction circuit and the error correction code corresponding to the corrected data. After correct data are written back to the volatile memory, the error correction to the data is not required. It is sufficient to correct the error in every data once. As a result, frequency of the error correction can be reduced, and an average value of access times can be shortened.

In a preferable example in one mode of the present invention, the volatile memory control circuit reads the data and the error correction code from the volatile memory in response to an access request from the exterior of the memory system, and writes back to the volatile memory the error-corrected data and the error correction code corresponding to the data. The memory controller outputs the error-corrected data to the exterior of the memory system. Executing the error correction upon every access request enables execution of the error correction only to data requiring the error correction. It is possible to prevent the time from the access request to the data output from increasing by executing the error correction a required minimum number of times. As a result, data read efficiency of the system can be improved.

For example, the volatile memory control circuit reads the data and the error correction code from the volatile memory during an idle state of the volatile memory. Further, the volatile memory control circuit writes back the error-corrected data and the error correction code corresponding to the data to the volatile memory. It is possible to reduce frequency at which an error is corrected at data read, by executing the error correction in a background. As a result, data read efficiency of the system can be improved.

In a preferable example in one mode of the present invention, a refresh control circuit periodically generates a refresh request. The volatile memory has a dynamic memory cell requiring a refresh operation. The volatile memory control circuit reads the data and the error correction code from the volatile memory in response to the refresh request. Thus, the refresh operation and the error correcting operation can be simultaneously executed. Further, since a failure such as a software error can be relieved by the error correction, reliability of the volatile memory can be improved.

In a preferable example in one mode of the present invention, the memory controller generates a volatile read-access signal for making read access to the volatile memory, or a nonvolatile write-access signal for making write access to the nonvolatile memory. Thus, the data and the error correction code stored in the volatile data area and the volatile additional area of the volatile memory are directly transferred to the nonvolatile data area and the nonvolatile additional area of the nonvolatile memory. The read operation of the volatile memory and the write operation of the nonvolatile memory are simultaneously executed, so that transfer time for the data and the error correction code can be shortened.

For example, the transfer of the data and the error correction code from the volatile memory to the nonvolatile memory is executed before the memory system is powered off upon a power-off request. Thus, time required for a power-off sequence can be shortened.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 2 is a timing chart showing the operation of a memory system shown in FIG. 1 at its power-on;

DESCRIPTION OF THE PREFERRED EMBODIMENTS

Figure 1:
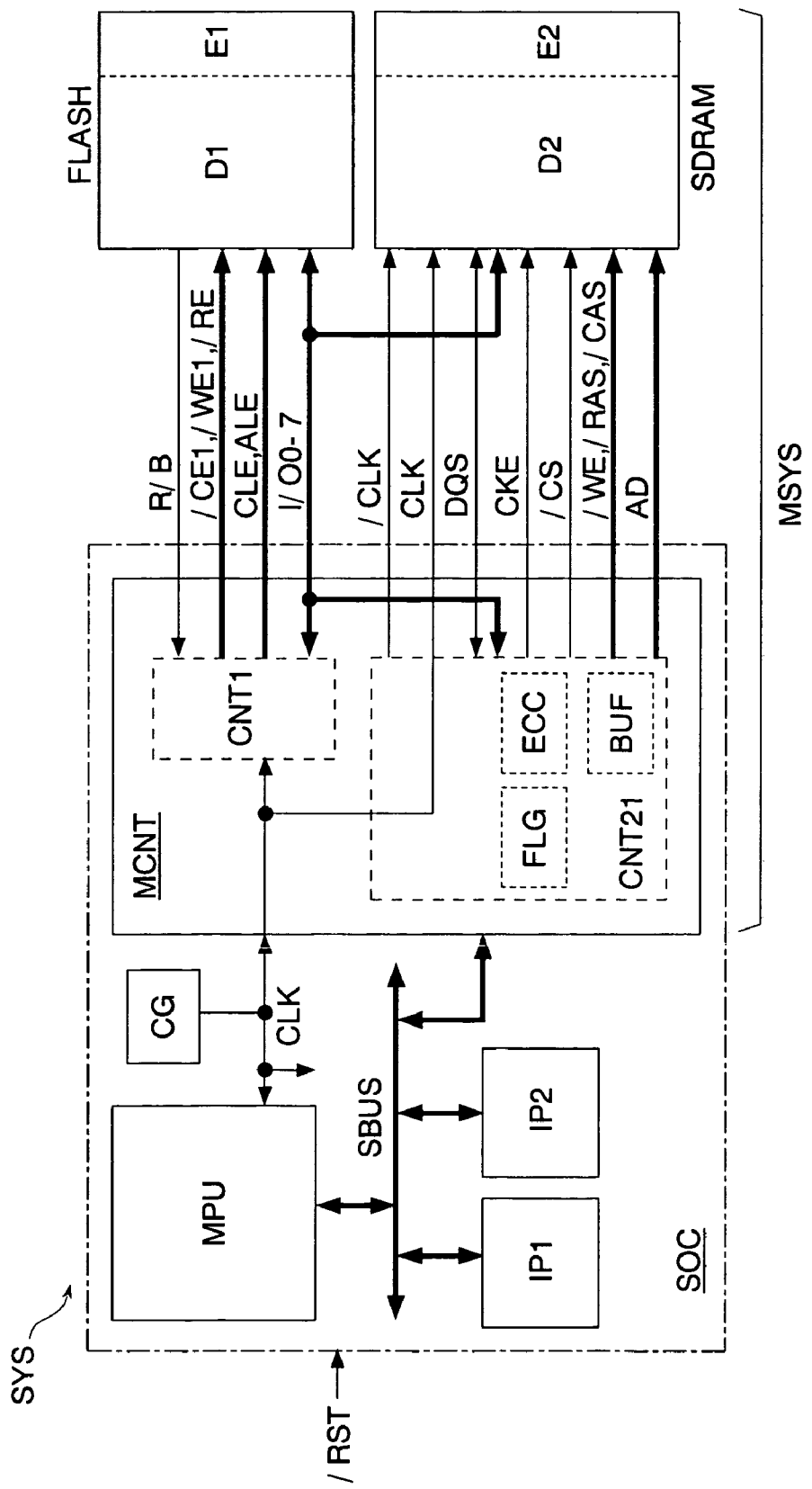
FIG. 1 is a block diagram showing a first embodiment of the present invention.

Embodiments of the present invention will next be explained by using the drawings. In these drawings, a signal line shown by a thick line is constructed by plural signal lines. One portion of a block connected to the thick line is constructed by plural circuits. The same reference numeral as a signal name is used with respect to the signal line to which a signal is transmitted. A signal adding symbol "/" to its head shows negative logic.

FIG. 1 shows a first embodiment of the present invention. A memory system MSYS is formed of a memory controller MCNT formed in a system-on chip SOC, flash memories FLASH of a NAND type, DDR-SDRAM (Double Data Rate Synchronous DRAM) connected to SOC, and a signal line wired between SOC, FLASH and SDRAM. SOC, FLASH and SDRAM are mounted onto a system board SYS together with unillustrated other chips. The system board SYS maintains a system reset signal /RST at a high logic level in a period able to operate SOC, FLASH and SDRAM. For example, the system board SYS is used as a main board of a mobile phone.

SOC has a micro controller MPU (system controller) for controlling the operation of the mobile phone, a peripheral circuit IP1 for realizing a radio communication function, a peripheral circuit IP2 for controlling the screen of the mobile phone, a clock generator CG for generating a clock signal CLK, a memory controller MCNT, a system bus SBUS connected to MPU, IP1, IP2 and MCNT.

FLASH is a multipurpose nonvolatile memory of a clock asynchronous type. FLASH has a ready/busy terminal R/B, a chip enable terminal /CE1, a write enable terminal /WE1, a read enable terminal /RE, a command latch enable terminal CLE, an address-latch enable terminal ALE and a data terminal I/O0-7. FLASH also has a data area D1 (a main memory and a nonvolatile data area) for storing real data, and an error correction code area E1 (a spare area and a nonvolatile additional area) for storing an error correction code. In this embodiment, a program executed by MPU to operate the mobile phone is stored in the data area D1 in advance, and the error correction code of the program stored in the data area D1 is stored in the error correction code area E1.

For example, FLASH has 32 k pages as a memory area. Each page is constructed by a data area D1 of 512 bytes (4096 bits) and an error correction code area E1 of 16 bytes (128 bits). In this embodiment, the detection and correction of a one-bit error or the detection of a two-bit error can be performed with respect to data of 4096 bits. Therefore, an error correction code of 13 bits is required. Accordingly, a bit width of the error correction code area E1 is set to 13 bits at its minimum. There is a margin with respect to the bit width (128 bits) of the error correction code area E1. Therefore, the error detection and correction of two bits or more can be also made.

SDRAM is a multipurpose volatile memory of a clock synchronous type, and has dynamic memory cells requiring a refresh operation. SDRAM has clock terminals CLK, /CLK, a clock enable terminal CKE, a chip select terminal /CS, a write enable terminal /WE, a row address strobe terminal/RAS, a column address strobe terminal /CAS, a data strobe signal terminal DQS, an address terminal AD and a data terminal I/O0-7. SDRAM also has a data area D2 (volatile data area) corresponding to the data area D1, and an error correction code area E2 (volatile additional area) corresponding to the error correction code area E1. The present invention can be also applied to SDRAM of an SDR (Single Data Rate) system.

The data area D2 is allocated to store a program read out of the data area D1 of FLASH. The error correction code area E2 is allocated to store an error correction code read out of the error correction code area E1 of FLASH. Further, SDRAM has an unillustrated buffer area for storing data required to operate the mobile phone in addition to areas D2, E2.

A common data bus line I/O0-7 shared by FLASH and SDRAM, and a dedicated control signal line (/CE1, /CS, etc.) in each of FLASH and SDRAM are wired between FLASH, SDRAM and memory controller MCNT.

Memory controller MCNT has a control unit CNT1 for controlling a read operation and a program operation (write operation) of FLASH, and a control unit CNT21 (volatile memory control circuit) for controlling a read operation, a write operation and a refresh operation of SDRAM. The control unit CNT1 outputs a signal for making access to FLASH in synchronization with a clock signal CLK.

The control unit CNT21 has an error correction circuit ECC, a flag area FLG and a buffer area BUF. The control unit CNT21 is operated in synchronization with the clock signal CLK, and outputs a signal for making access to SDRAM. The control unit CNT21 holds program data and an error correction code read out of SDRAM to buffer area BUF, and transfers the program data and the error correction code to error correction circuit ECC. Further, the control unit CNT21 has a function for writing-back the program data corrected with respect to an error and the error correction code for correcting the error in these program data to buffer area BUF and SDRAM.

Further, the control unit CNT21 outputs a clock signal /CLK having a phase reverse to that of the clock signal CLK, and a data strobe signal DQS. The data strobe signal DQS is outputted from the control unit CNT21 in synchronization with a write data signal I/O0-7 at a write operation of SDRAM. On the other hand, the data strobe signal DQS is outputted from SDRAM in synchronization with a read data signal I/O0-7 at a read operation of SDRAM. The control unit CNT21 also has a function of a refresh control circuit for refresh-operating SDRAM.

The error correction circuit ECC has a function using the program data and the error correction code read out of SDRAM, and correcting the error in the program data. An error correction circuit in the related art can be utilized by forming the error correction circuit ECC in memory controller MCNT. As a result, a circuit design can be easily made. Reading, error correction and writing-back of one time are executed with data of 512 bytes and an error correction code of two bytes as one unit (514 bytes in total corresponding to one page of FLASH). Therefore, the control unit CNT21 has a function for executing a burst read operation of at least 514 bytes and a burst write operation of 514 bytes by utilizing buffer area BUF.

A flag area FLG has plural flags for storing that the program data are supplied to the error correction circuit ECC and the error correction is executed. Each flag is formed correspondingly to one page (514 bytes; a storing position of data) of SDRAM. The control unit CNT21 resets each flag at a power-on time, and sets the corresponding flag in synchronization with the supply of the program data to the error correction circuit ECC.

The flag is set irrespective of the existence of an error when an error correcting operation is executed. The flag may be also set by the error correction circuit ECC. Further, when the control unit CNT21 reads a page (program data and an error correction code) set in the flag, the control unit CNT21 judges that an error in these program data is already corrected, and corrects no error. Accordingly, in this case, no write-back operation is also executed. Namely, the error correction and the writing-back of each page are performed only once after power-on of the memory system MSYS. Thus, frequency of the error correction can be reduced, and total time required for the error correction can be shortened. As a result, an average value of access times can be shortened, and read efficiency of MPU relative to the program data can be improved.

Figure 2:
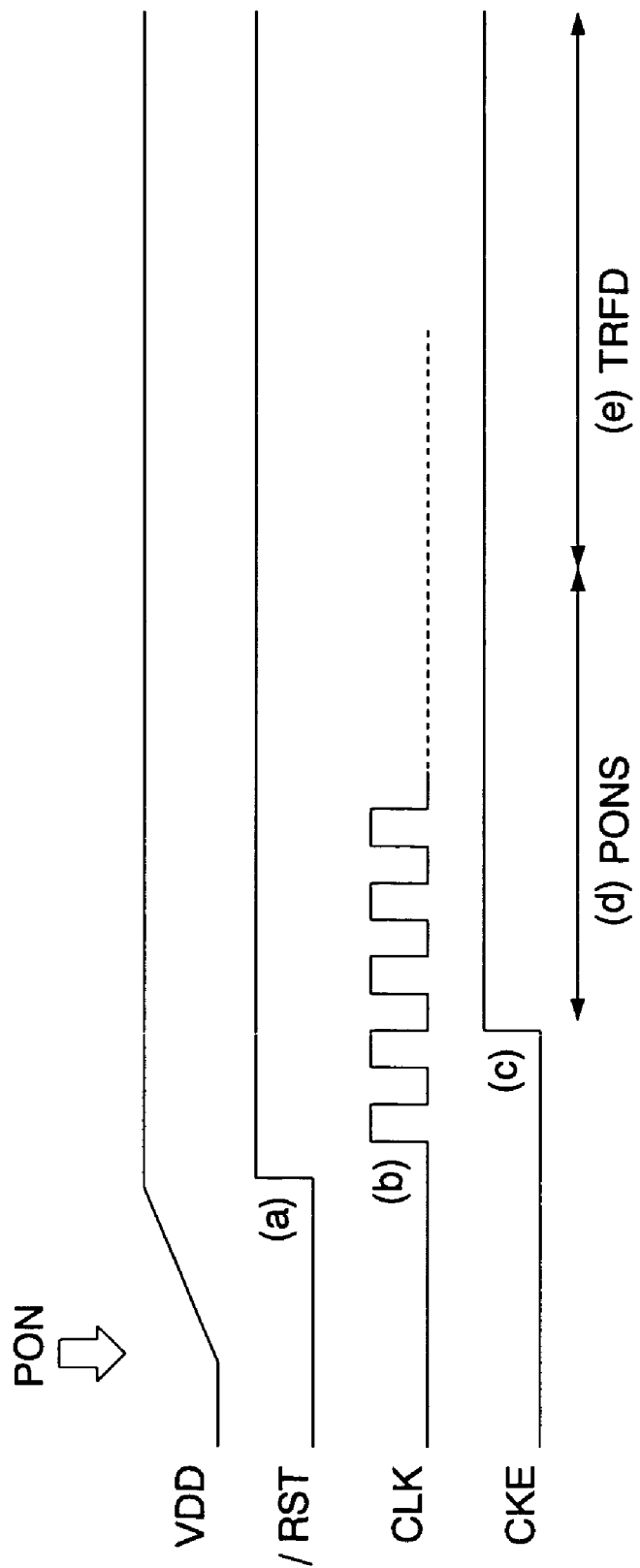

FIG. 2 shows the operation of the memory system MSYS shown in FIG. 1 at its power-on time. A power supply voltage VDD is supplied to the system board SYS (PON). When the power supply voltage VDD reaches a predetermined voltage, the system reset signal /RST is changed from a low logic level to a high logic level (FIG. 2(a)). SOC starts generation of the clock signal CLK in response to the change to the high logic level of the system reset signal /RST (FIG. 2(b)). The clock signal CLK is supplied to function blocks within SOC such as control unit CNT1, SDRAM, MPU, IP1, IP2, etc. The control unit CNT21 changes the clock enable signal CKE to a high logic level after a predetermined number of clocks.

Next, the control unit CNT21 supplies a predetermined command group of a precharge command, an auto-refresh command, a mode-register set command, etc. to SDRAM to execute a power-on sequence PONS of SDRAM (FIG. 2(c)). After the power-on sequence PONS is completed, the control unit CNT1 sequentially outputs a read command (nonvolatile read-access signal) to FLASH for reading the program data and the error correction code from FLASH. The control unit CNT21 sequentially outputs a write command (volatile write-access signal) to SDRAM for writing the program data and the error correction code read out of FLASH to SDRAM. Namely, generation of the read command and the write command is started in synchronization with power-on. A transfer operation TRFD for transferring the program data and the error correction code from FLASH to SDRAM is then executed (FIG. 2(c)). The details of the transfer operation TRFD will be explained in FIG. 3 described later.

The program data and its error correction code stored in FLASH are written to SDRAM by completing the transfer operation TRFD. However, in this state, no error in the program data is corrected. Therefore, no MPU can read and execute the program.

Figure 3:
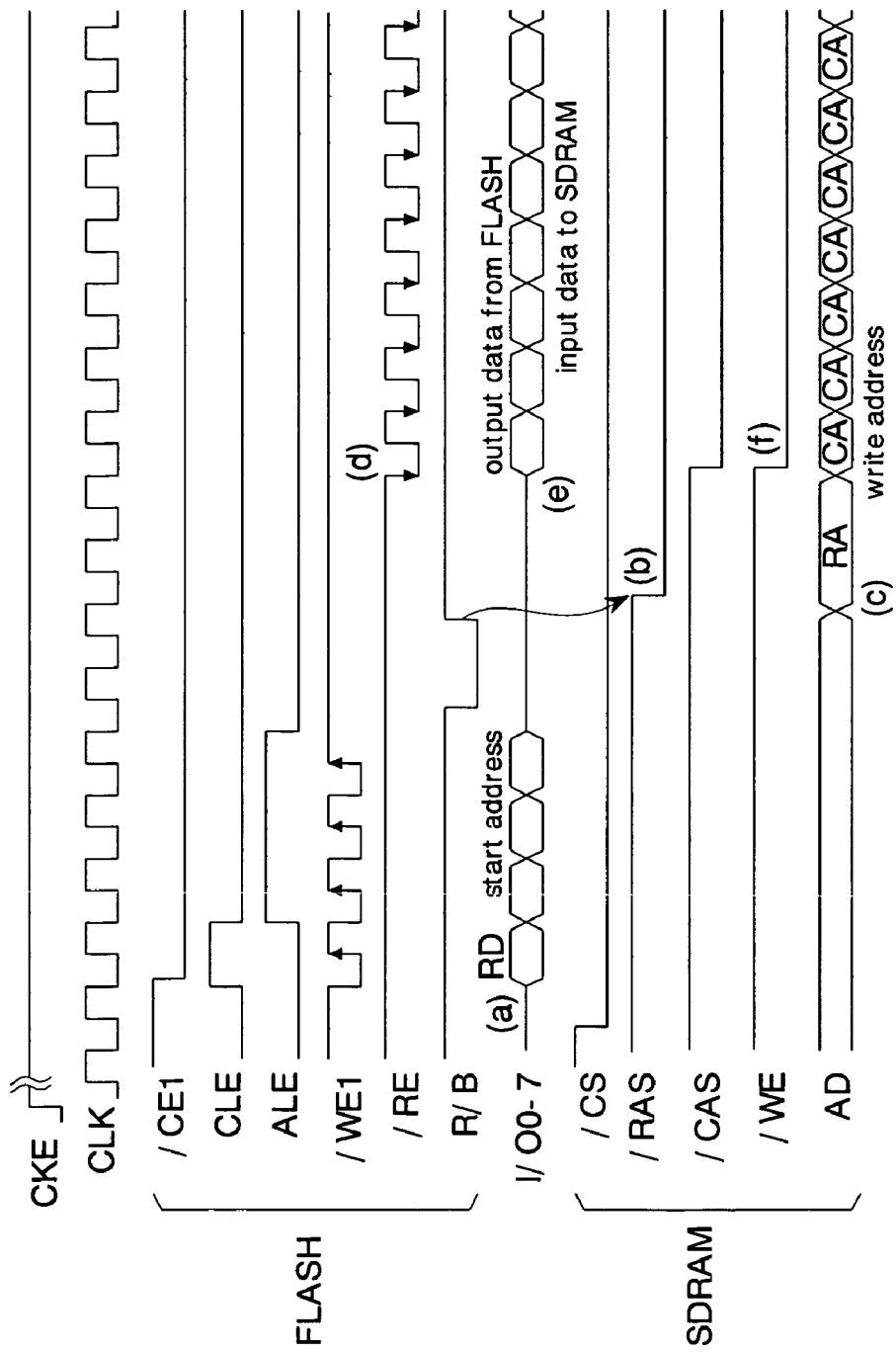
FIG. 3 is a timing chart showing the details of a transfer operation of data from FLASH to SDRAM shown in FIG. 2.

FIG. 3 shows the details of the transfer operation TRFD of data from FLASH to SDRAM shown in FIG. 2. SDRAM selects a burst transfer mode by a mode-register set command in advance.

First, the control unit CNT1 outputs a read code RD and a start address to a data bus line I/O0-7 so as to read the program data and the error correction code from FLASH (FIG. 3(a)). The control unit CNT21 activates signal /RAS in response to the high logic level of signal R/B received by the control unit CNT1, and simultaneously outputs a row address RA (FIGS. 3(b) and 3(c)).

After a predetermined time from the activation of signal /RAS, the control unit CNT1 outputs signal /RE in synchronization with a clock signal CLK (FIG. 3(d)). Data (program) are read from FLASH in synchronization with a fall edge of signal /RE (FIG. 3(e)). The control unit CNT21 activates signals /CAS and /WE in synchronization with a first fall edge of signal /RE, and simultaneously outputs a column address CA (write address) (FIG. 3(f)). Thus, the program read out of FLASH is directly written to SDRAM through the common data bus line I/O0-7.

In the transfer operation TRFD, a read command (/RE) to FLASH and a write command (/WE) to SDRAM are supplied in synchronization with each other. Thus, the program data and the error correction code can be directly transferred from FLASH to SDRAM. Accordingly, transfer time for the program data and the error correction code can be shortened, and time from power-on to access beginning using MPU can be shortened. The transfer of the error correction code from FLASH to SDRAM is also similarly executed.

Figure 4:
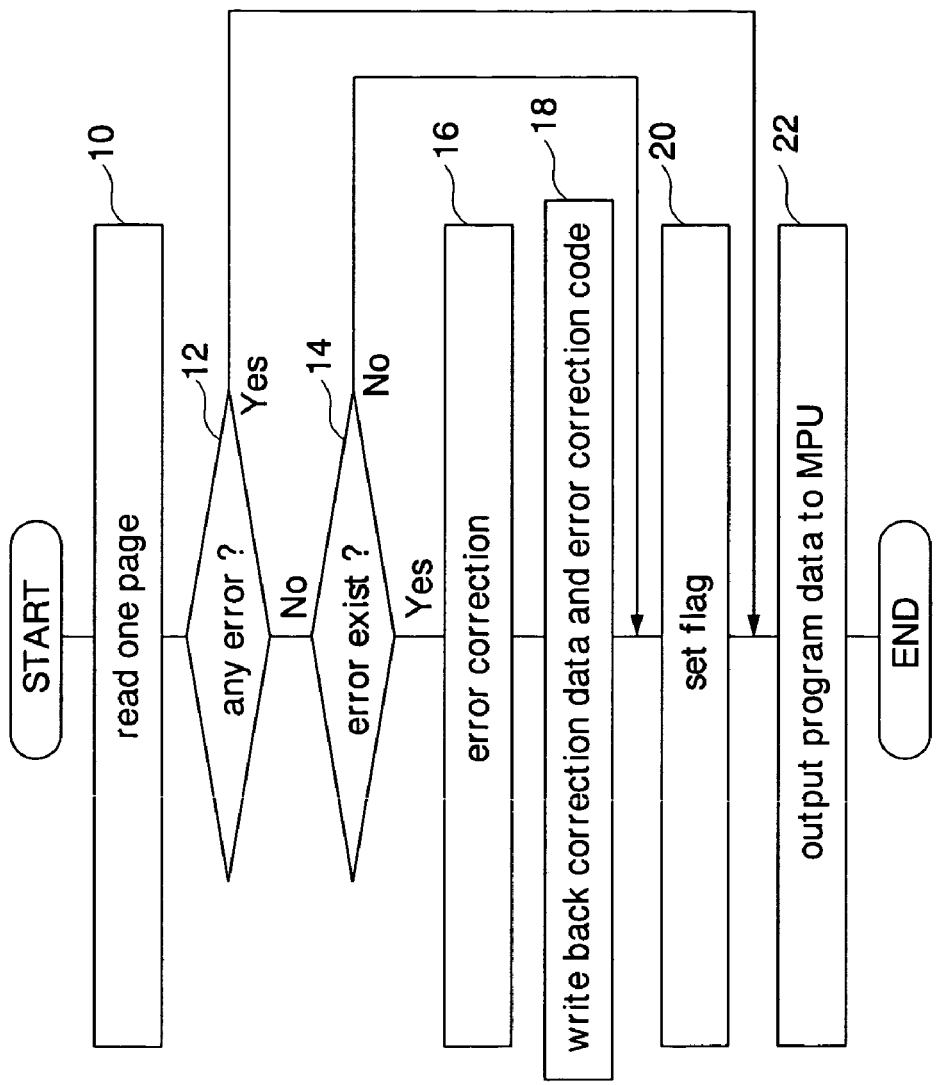
FIG. 4 is a flow chart showing the operation of a control unit CNT21 when an access request is received from MPU shown in FIG. 1.

FIG. 4 shows the operation of the control unit CNT21 when an access request is received from MPU shown in FIG. 1. This operation is executed by hardware formed in the control unit CNT21. Here, the access request corresponds to a fetch operation of the program using MPU. In this embodiment, the error correction of the program data is executed upon every access request. Thus, an error in only the program data required for MPU can be corrected. Further, the error correction is executed only once on each page. It is possible to prevent that time from the access request to the output of data is lengthened by executing only the error correction of a required minimum limit. As a result, data read efficiency of the system can be improved.

First, in step S10, the control unit CNT21 reads the corresponding program data of a one-page amount from SDRAM in response to the access request, and holds the read program data in buffer area BUF. In step S12, the control unit CNT21 judges whether an error in the read program data is already corrected or not. Namely, it is judged whether a flag corresponding to the read page is set or not. When the flat is set, a correcting operation using the error correction circuit ECC is already executed. Therefore, processing proceeds to step S22. In contrast to this, when no flat is set, the processing proceeds to step S14 so as to correct the error in the read program data.

In step S14, the existence of the error in the read program data is judged by the error correction circuit ECC (error detection). When there is no error, the processing proceeds to step S20. Namely, when no error is detected, the error correcting operation and the write-back operation of step S18 described later are not executed. Thus, step S22 described later is early executed. Therefore, the program data can be rapidly outputted to MPU. In contrast to this, when there is an error, the processing proceeds to step S16. In step S16, the error correction is executed by the error correction circuit ECC.

Next, in step S18, the control unit CNT21 writes back the corrected program data and an error correction code newly generated to buffer area BUF and SDRAM. In step S20, the control unit CNT21 sets the flag corresponding to the read page. Next, in step S22, the control unit CNT21 sequentially outputs the program data held in buffer area BUF to MPU through a system bus SBUS (e.g., a unit of 32 bits). An output operation of the program data responsive to the access request is then completed.

When no control unit CNT21 can temporarily output the program data to MPU by the error correction, etc., the control unit CNT21 outputs a wait signal to MPU. In this case, an output period of the wait signal can be shortened by simultaneously executing steps S18 and S22. Therefore, MPU can early fetch the program data.

Figure 5:
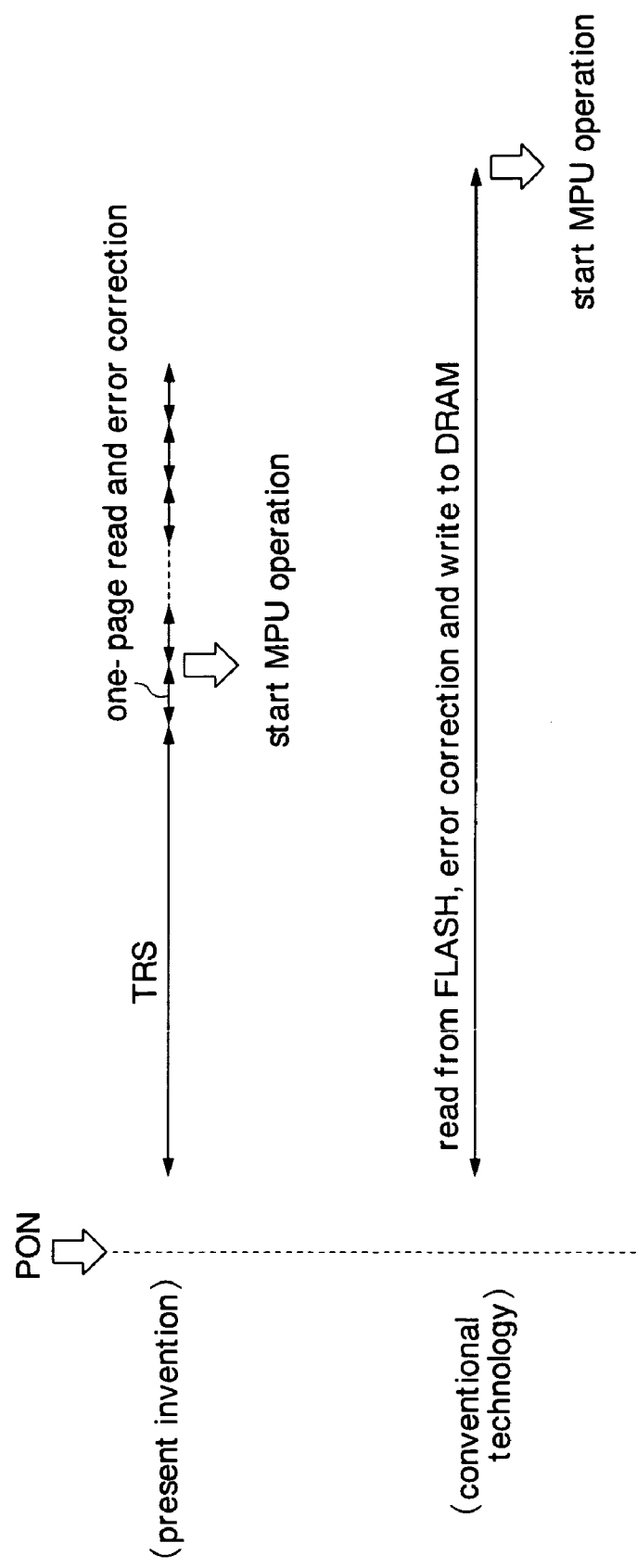
FIG. 5 is an explanatory view for the time from power-on to MPU's start of an operation.

FIG. 5 shows time from power-on to beginning of the operation of MPU. In the present invention, MPU can fetch a program just after an error in data of a first one-page amount read out of SDRAM is corrected. Further, the error correction is executed in response to the access request from MPU. Therefore, even when the access request of a page different in accordance with branch instructions, etc. is generated, it is sufficient to set a wait period to an error correction period of the one-page amount.

In contrast to this, in the prior art no MPU can fetch the program unless all the program data read out of FLASH and error-corrected are transferred to SDRAM. This is because it is impossible to cope with issuance of the branch instructions since the transfer from FLASH to SDRAM and the error correction are sequentially executed e.g., from a low order address to a high order address.

As mentioned above, in the first embodiment, the transfer time for the program data from FLASH to SDRAM can be shortened by transferring the program data stored in FLASH to SDRAM together with the error correction code without making the error correction. Accordingly, it is possible to shorten the time from beginning of the data transfer from FLASH to SDRAM to a point at which the data becomes accessible. Further, it is possible to shorten the time from the beginning of the transfer of the program data from FLASH to SDRAM to a point at which the program data becomes accessible by MPU, by making the error correction to the program data read upon every access request. In particular, the time from the power-on to the start of the access by MPU can be further shortened. As a result, usability of a mobile phone can be improved.

Figure 6:
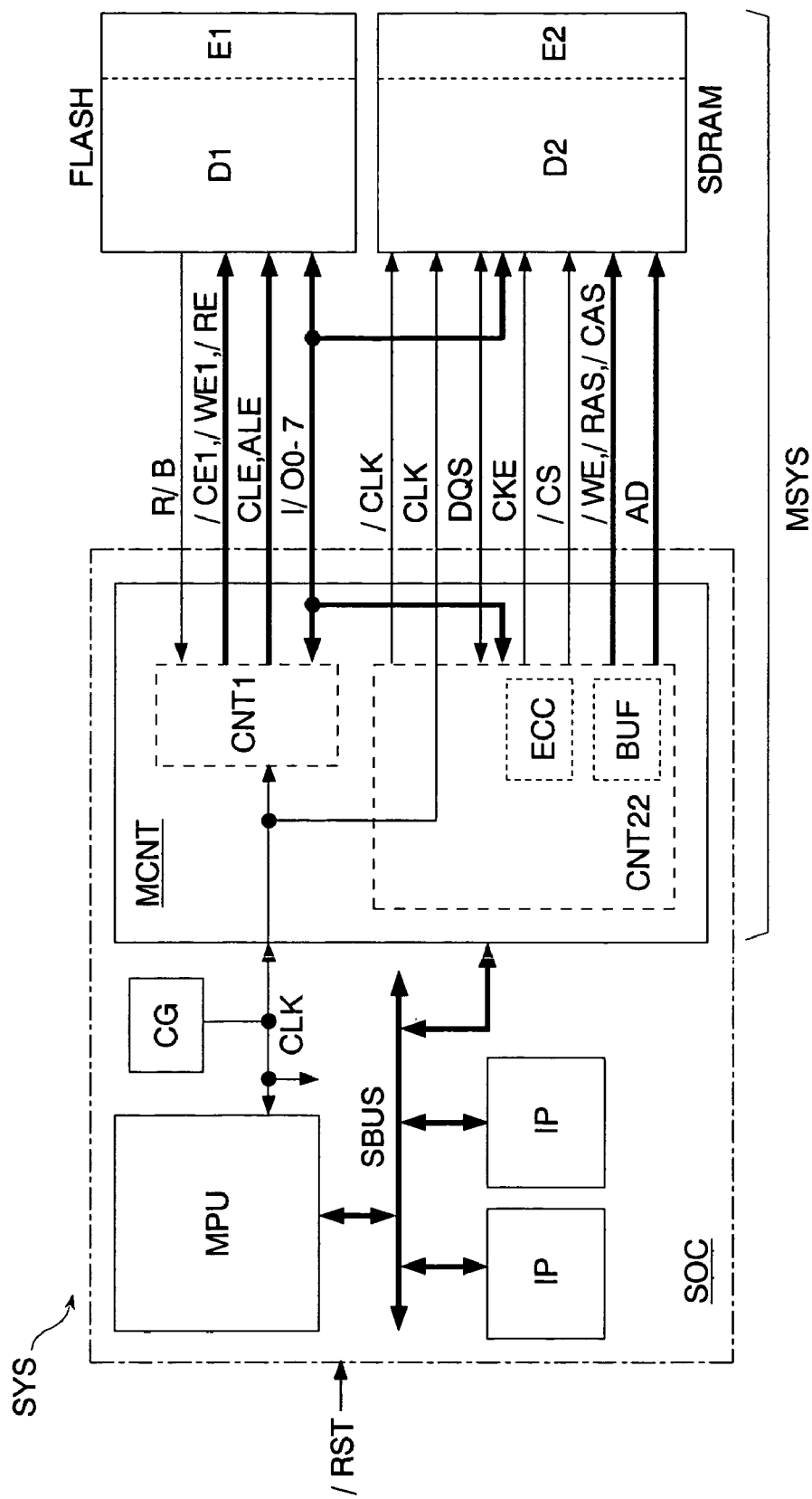
FIG. 6 is a block diagram showing a second embodiment of the present invention.

FIG. 6 shows a second embodiment of the present invention. The same elements as the elements explained in the first embodiment are designated by the same reference numerals, and detailed explanations of these elements, etc. are omitted. In this embodiment, a control unit CNT22 is formed instead of the control unit CNT21 of the first embodiment. The other constructions are the same as the first embodiment. The control unit CNT22 is constructed by removing the flag area FLG from the control unit CNT21 of the first embodiment.

Figure 7:
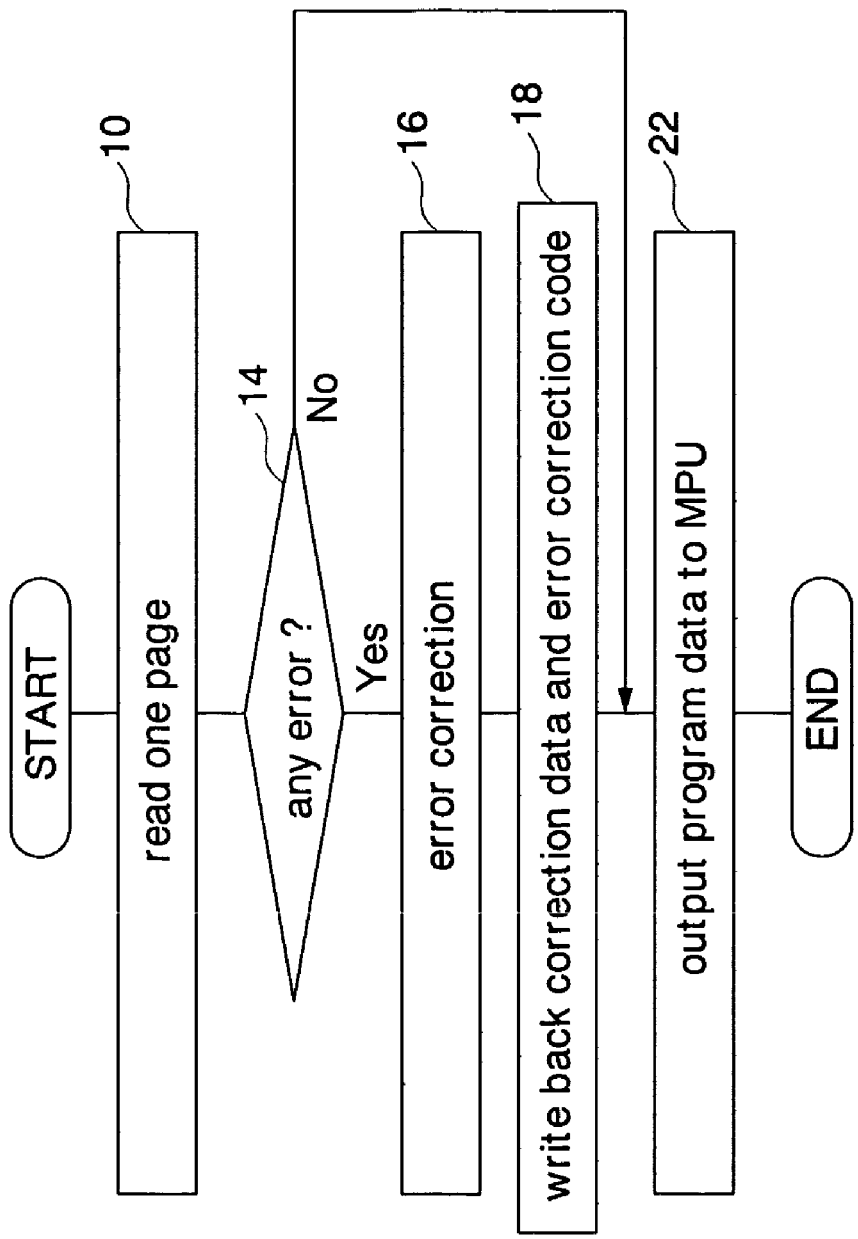
FIG. 7 is a flow chart showing the operation of a control unit CNT22 when an access request is received from MPU shown in FIG. 6.

FIG. 7 shows the operation of the control unit CNT22 when an access request is received from MPU in the second embodiment. An operation flow of the control unit CNT22 of this embodiment is constructed by removing steps S12 and S20 from the flow shown in FIG. 4. Namely, the control unit CNT22 always executes the error correction upon every reading of program data of one page. Thus, a failure generated within SDRAM by a software error, etc. can be relieved and the program data corrected with respect to an error can be outputted to MPU.

As mentioned above, in the second embodiment, effects similar to those of the first embodiment can be also obtained. Further, since the failure can be relieved, reliability of SDRAM can be improved. Further, since no flag area FLG is required, the circuit scale of a memory controller MCNT can be reduced.

Figure 8:
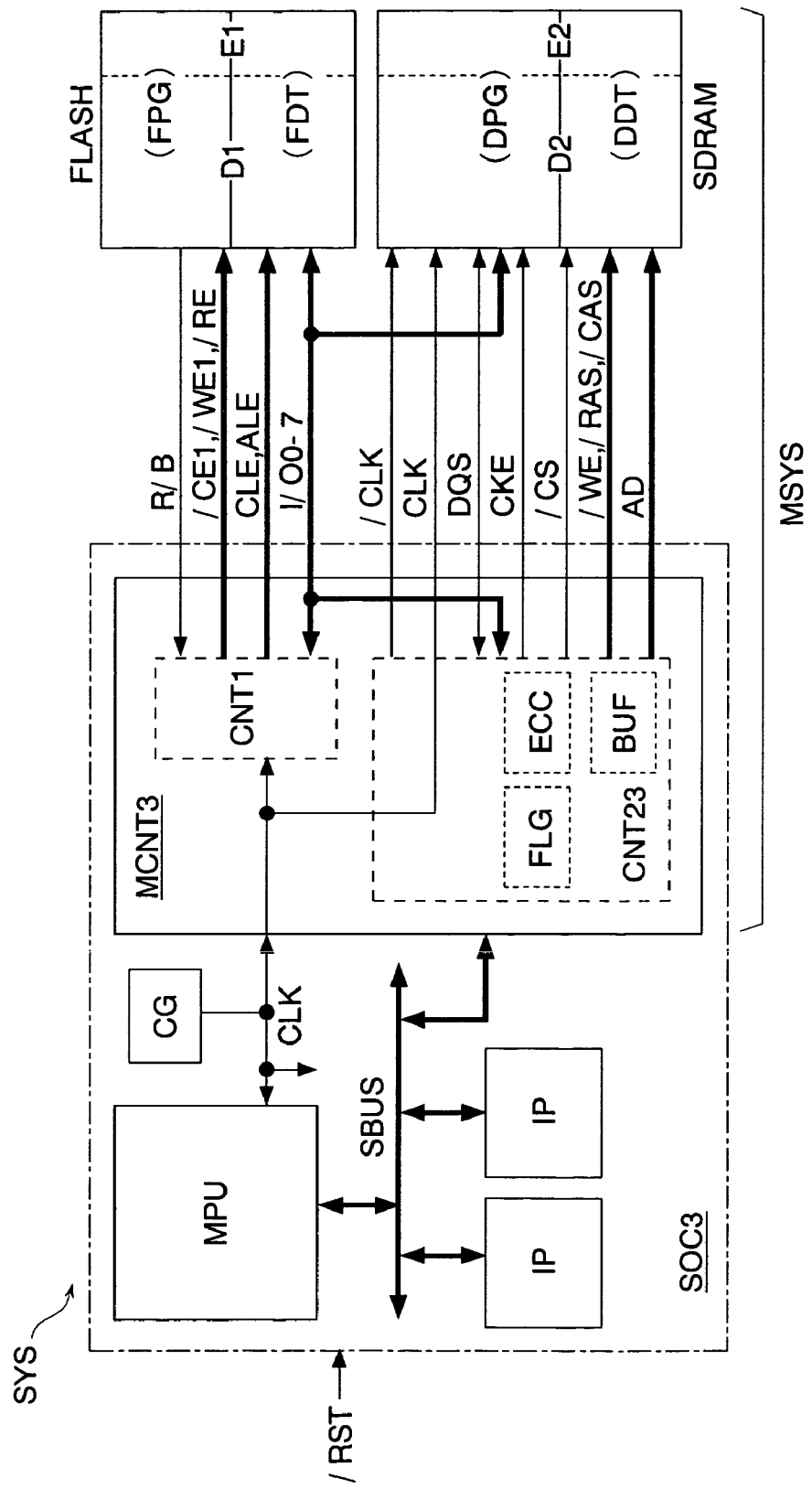
FIG. 8 is a block diagram showing a third embodiment of the present invention.

FIG. 8 shows a third embodiment of the present invention. The same elements as the elements explained in the first embodiment are designated by the same reference numerals, and detailed explanations of these elements, etc. are omitted. In this embodiment, a control unit CNT23 is formed instead of the control unit CNT21 of the first embodiment. Further, in FLASH, a program area FPG for storing a program, and a data area FDT for storing data are allocated. In SDRAM, a program area DPG for storing a program, and a data area DDT for storing data are allocated. The other constructions are the same as the first embodiment. A system board SYS is used as a main board of a mobile phone having e.g., a camera function.

The program data executed by MPU are stored in program areas FPG, DPG. Various kinds of parameters required for the operation of the mobile phone, a start-up screen, image data photographed by a camera function, etc. are stored in data areas FDT, DDT. In general, no program data are changed during time from power-on to power-off. On the other hand, data of a parameter, etc. are changed by the operation of a user after power-on, and it is also necessary to hold the data after power-off. Further, it is necessary to save the image data photographed by the camera function in FLASH until power-off. Therefore, in this embodiment, data are transferred from SDRAM to FLASH at the power-off and photographing. The photographed image data are written to SDRAM together with the error correction code at every photographing. The error correction code is generated by the error correction circuit ECC by using the image data. The image data and the error correction code corresponding to the image data are written to FLASH by using the image data and the error correction code stored in SDRAM.

Figure 9:
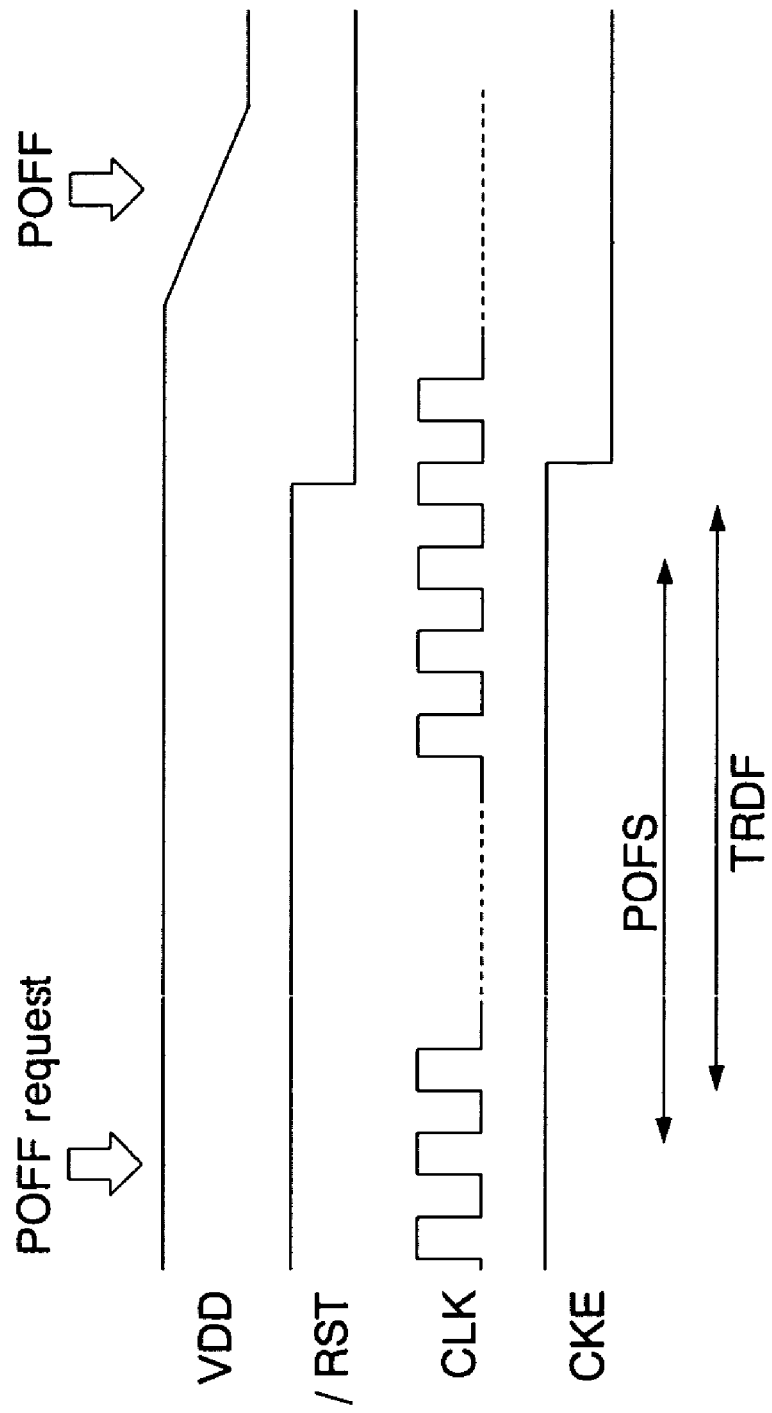
FIG. 9 is a timing chart showing the operation of a memory system shown in FIG. 8 at its power-off.

FIG. 9 shows the operation of the memory system MSYS shown in FIG. 8 at the power-off time. The operation at a power-on time is the same as the above FIGS. 2 and 3. First, when a power switch is turned off by the operation of a user, etc. (power-off (POFF) request), MPU executes a power-off sequence POFS. The control unit CNT23 executes a transfer operation TRDF of data from SDRAM to FLASH in parallel with the power-off sequence POFS. The transfer operation TRDF is an operation for writing all of a program, data and these error correction codes held in SDRAM to FLASH. After the transfer operation TRDF is completed, a reset signal /RST is activated to a low logic level by the system board SYS, and a clock signal CLK is stopped, and a clock enable signal CKE is non-activated. Thereafter, the supply of a power supply voltage VDD is stopped, and power of the memory system MSYS is turned off (POFF). Namely, the transfer operation TRDF is executed just before power-off of the memory system MSYS in synchronization with this power-off.

More particularly, the control unit CNT23 outputs a read command (volatile read-access signal) to SDRAM for reading a program, data and these error correction codes from SDRAM. The control unit CNT1 outputs a write command (nonvolatile write-access signal) to FLASH for writing the program, the data and these error correction codes read out of SDRAM to FLASH. The details of the transfer operation TRDF will be explained in FIG. 10 described later.

Figure 10:
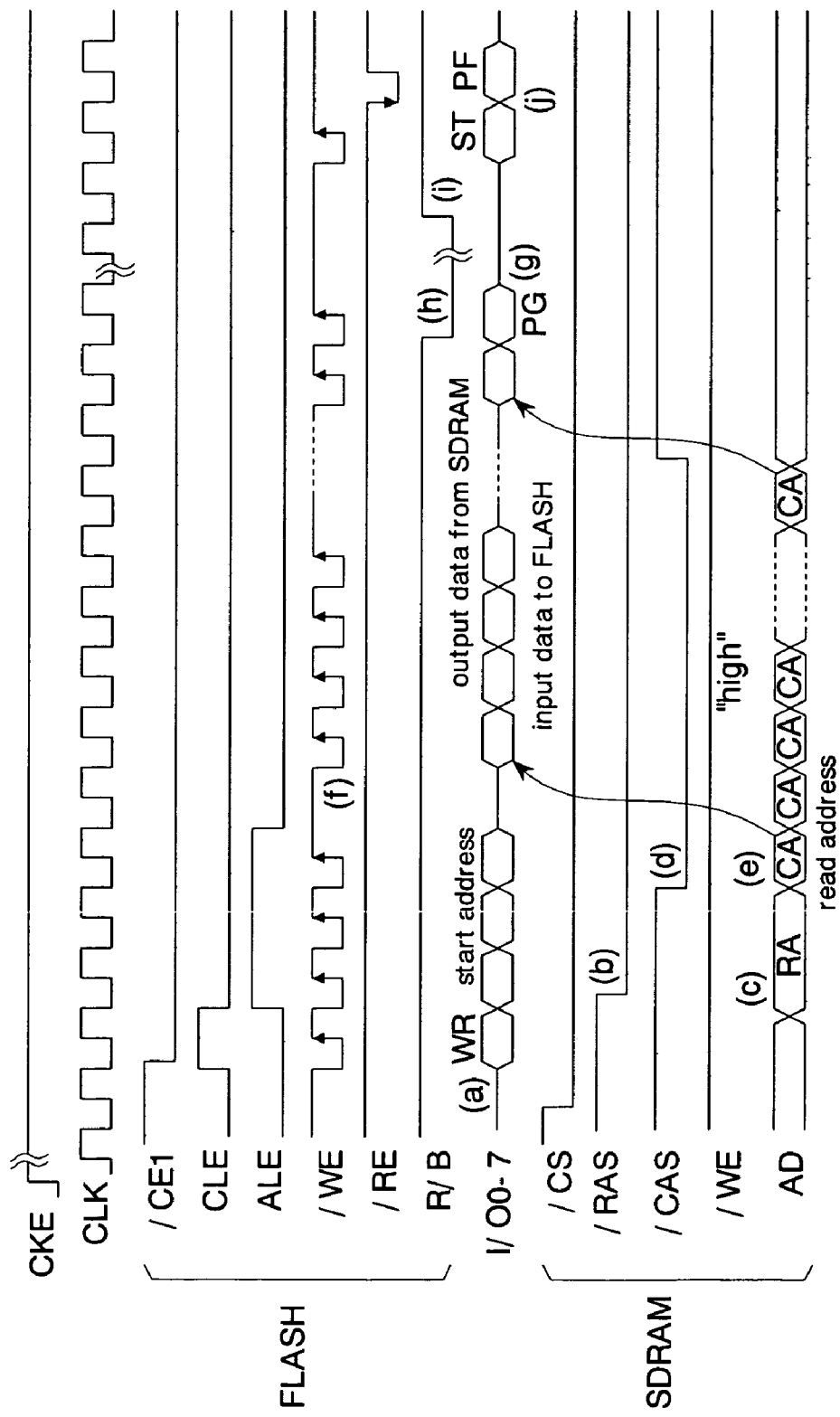
FIG. 10 is a timing chart showing the details of a transfer operation of data from SDRAM to FLASH shown in FIG. 8.

FIG. 10 shows the details of the transfer operation TRDF of data from SDRAM to FLASH shown in FIG. 9. The transfer operation TRDF is executed in synchronization with a power-off request. Otherwise, the transfer operation TRDF is executed in synchronization with writing of image data from the system board SYS side to SDRAM at a photographing time using a camera function. SDRAM selects a burst transfer mode by a mode-register set command in advance.

First, the control unit CNT1 outputs a write code WR (page program code) and a start address to data bus line I/O0-7 to write a program, data and an error correction code to FLASH (FIG. 10(a)). The control unit CNT23 activates signal /RAS and simultaneously outputs a row address RA (FIGS. 10(b) and 10(c)). Further, the control unit CNT23 activates signal /CAS after a predetermined time from the activation of signal /RAS, and simultaneously outputs a column address CA (read address) (FIGS. 10(d) and 10(e)). Since signal /WE is held to a high logic level, a burst read operation of SDRAM is executed.

The control unit CNT1 repeatedly activates signal /WE in synchronization with timing for outputting data from SDRAM (FIG. 10(f)). Thus, the program read out of SDRAM is written to a data register (page buffer) of FLASH through common data bus line I/O0-7. Thus, in the transfer operation TRDF, a read command (/WE=High) to SDRAM and a write command (/WE) to FLASH are supplied in synchronization with each other. Thus, the program data and the error correction code can be directly transferred from SDRAM to FLASH. Accordingly, transfer time of the program data and the error correction code can be shortened, and time required for the power-off sequence can be shortened.

Thereafter, FLASH programs data within a data register in a memory cell array by receiving a program code PG from the control unit CNT1 (FIG. 10(g)). FLASH then holds a signal R/B in a low logic level during the program operation (FIG. 10(h)). The control unit CNT1 detects termination of the program operation by the signal R/B changing to the high logic level (FIG. 10(i)). Further, the control unit CNT1 writes a status code ST to FLASH so as to check a programming result, and receives a pass/fail code PF from FLASH (FIG. 10(j)). The transfer operation TRDF is then completed. The transfer of the error correction code from SDRAM to FLASH is also similarly executed.

As mentioned above, in the third embodiment, effects similar to those of the first embodiment can be also obtained. Further, in a system in which it is necessary to write data to FLASH, it is possible to shorten transfer time for data and an error correction code from SDRAM to FLASH. In particular, when the data transfer TRDF is executed in synchronization with power-off, time required for the power-off sequence can be shortened.

Figure 11:
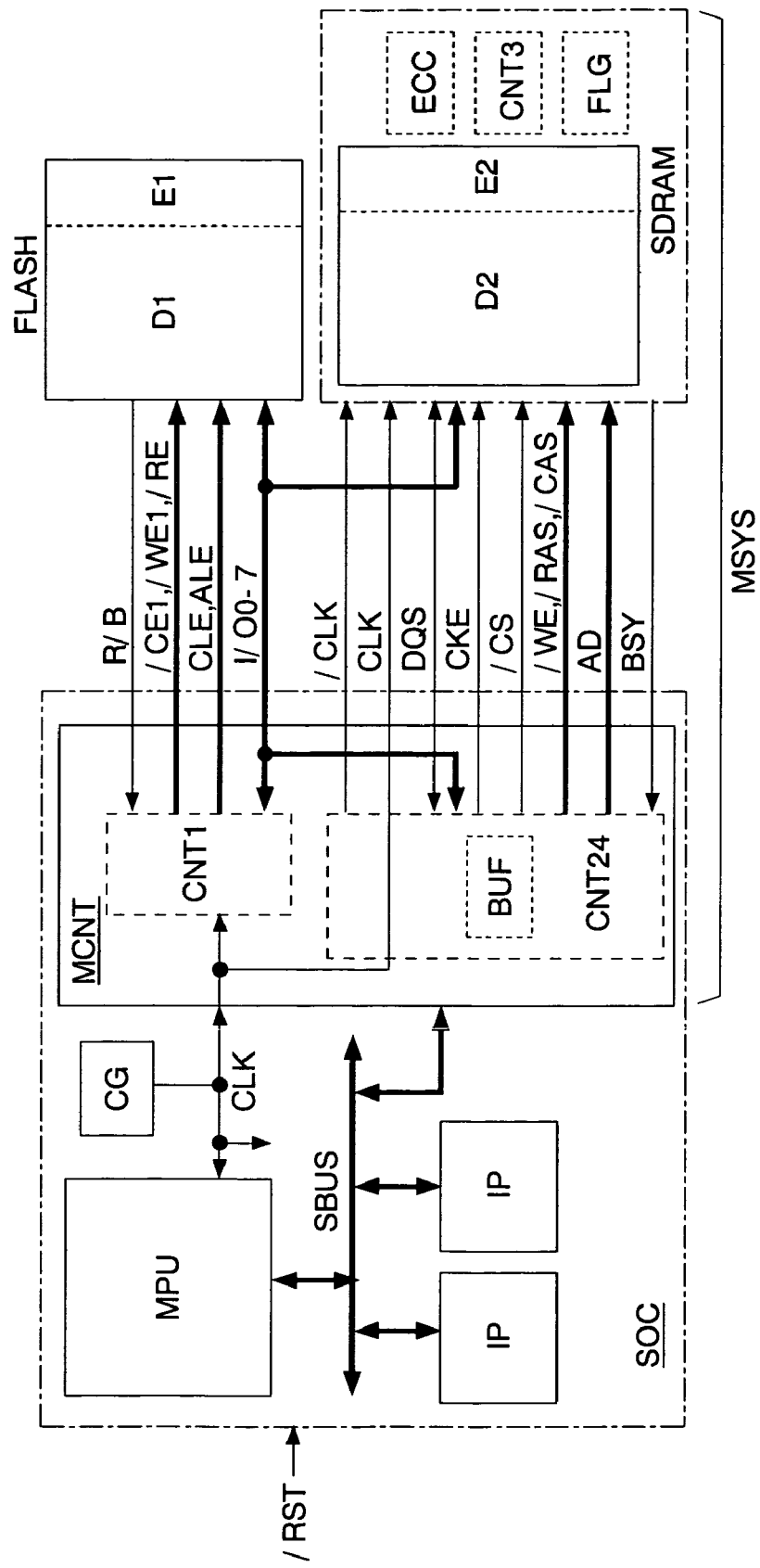
FIG. 11 is a block diagram showing a fourth embodiment of the present invention.

FIG. 11 shows a fourth embodiment of the present invention. The same elements as the elements explained in the first embodiment are designated by the same reference numerals, and detailed explanations of these elements, etc. are omitted. In this embodiment, a control unit CNT24 is formed instead of the control unit CNT21 of the first embodiment. Further, SDRAM has an error correction circuit ECC, a control unit CNT3 (volatile memory control circuit) for controlling the operation of the error correction circuit ECC, and a flag area FLG. SDRAM has a terminal for outputting a busy signal BSY during error correction processing. The other constructions are the same as the first embodiment.

The control unit CNT24 is constructed by removing the error correction circuit ECC and the flag area FLG from the control unit CNT21 of the first embodiment. Namely, in this embodiment, the error correction of a program transferred from FLASH to SDRAM and management of the existence of the error correction of each page (512 bytes+16 bytes) are executed by SDRAM. It is not necessary to output data and the error correction code to the exterior at an error correcting operation time by forming the error correction circuit ECC within SDRAM. As a result, the error correcting operation can be efficiently executed for a short time.

The operation of SDRAM at a receiving time of an access request from MPU is the same as the operation of the control unit CNT21 shown in FIG. 4. However, in an operation corresponding to step S22 of FIG. 4, program data are outputted to MPU through the control unit CNT24, and are simultaneously held to buffer area BUF. Further, SDRAM outputs the busy signal BSY during steps S14 to S20 of FIG. 4.

Data of one page (4224 bits) can be read in one read cycle by devising architecture of SDRAM. Concretely, 4224 dynamic memory cells are connected to one word line, and the read operation and the write-back operation are executed in a state for continuously selecting the word line. Thus, the reading-out, the error correction, the writing-back and the flag set (corresponding to steps S14 to S20) can be executed in several clock cycles (e.g., 4 clock cycles). Namely, a wait cycle number inserted during the operation of MPU can be minimized.

As mentioned above, in the fourth embodiment, effects similar to those of the first embodiment can be also obtained. Further, the error correcting operation can be efficiently executed for a short time by forming the error correction circuit ECC within SDRAM.

Figure 12:
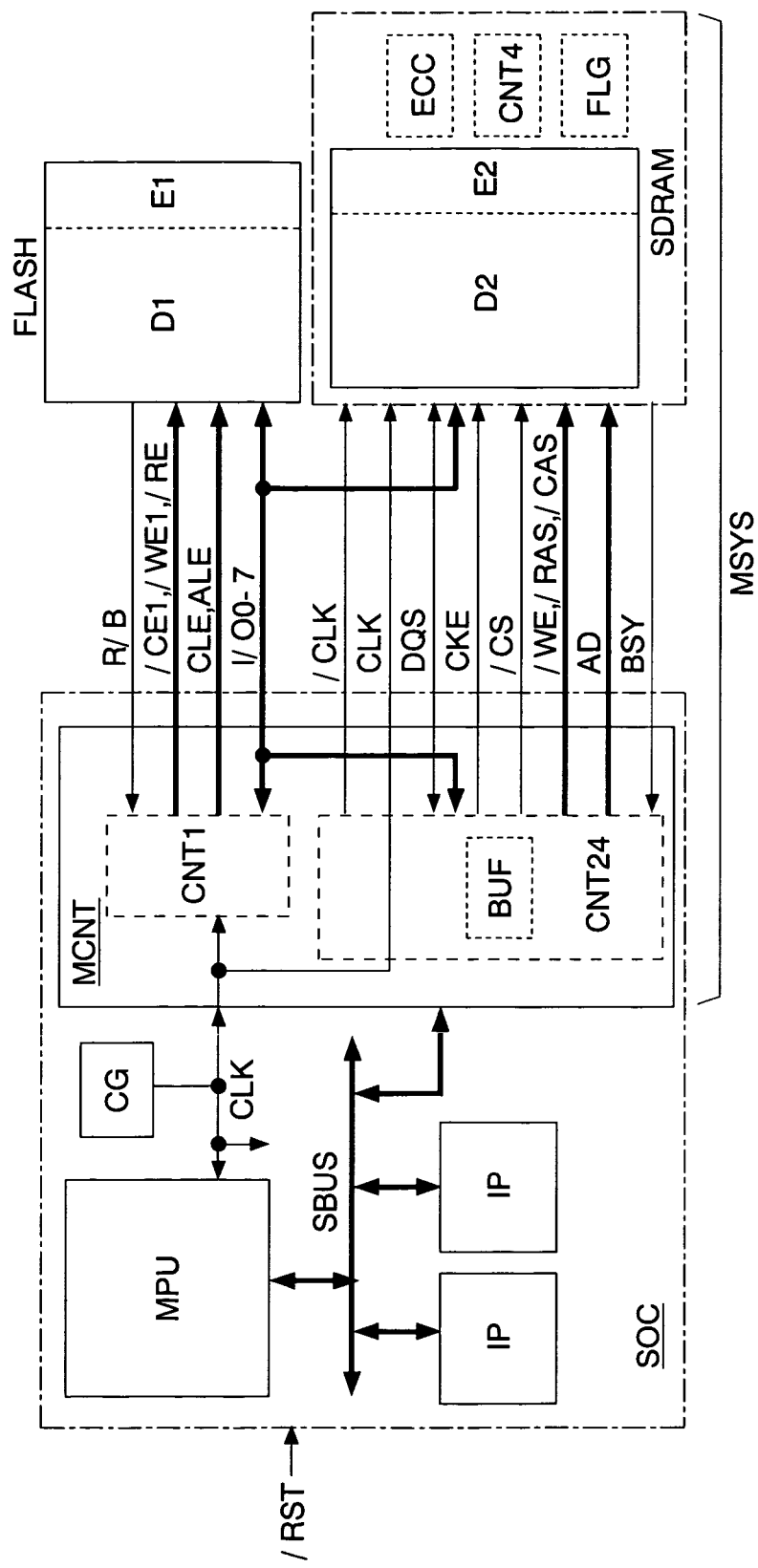
FIG. 12 is a block diagram showing a fifth embodiment of the present invention.

FIG. 12 shows a fifth embodiment of the present invention. The same elements as the elements explained in the first and fourth embodiments are designated by the same reference numerals, and details explanations of these elements, etc. are omitted. In this embodiment, a control unit CNT4 is formed instead of the control unit CNT3 of the fourth embodiment. The other constructions are the same as the fourth embodiment.

The control unit CNT4 has a function for executing an error correcting operation during an idle having no access request with respect to SDRAM in addition to the function of the control unit CNT3 of the fourth embodiment. Here, the error correcting operation is an operation corresponding to steps S10 to S20 shown in FIG. 4 mentioned above. A flag corresponding to each page can be set irrespective of a fetch operation of MPU by executing the error correction during the idle. As a result, the total number of wait cycles inserted during the operation of MPU can be reduced, and operation efficiency of the system can be improved.

As mentioned above, the fifth embodiment can also obtain effects similar to those of the first and fourth embodiments. Further, frequency for making the error correction can be reduced at a reading time of data by executing the error correction in a background. As a result, data read efficiency of the system can be improved.

Figure 13:
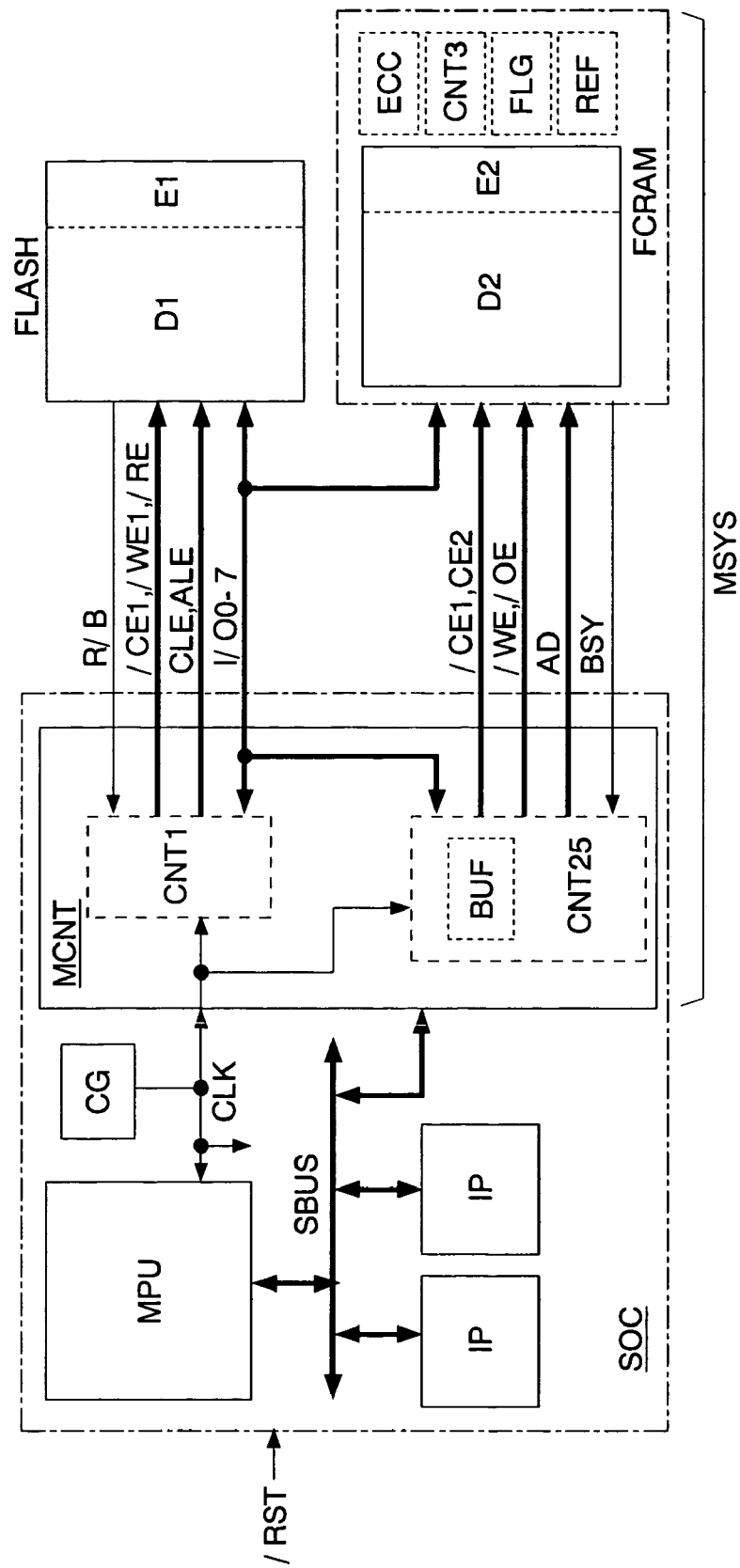
FIG. 13 is a block diagram showing a sixth embodiment of the present invention.

FIG. 13 shows a sixth embodiment of the present invention. The same elements as the elements explained in the first and fourth embodiments are designated by the same reference numerals, and detailed explanations of these elements, etc. are omitted. In this embodiment, FCRAM (Fast Cycle RAM) is formed instead of SDRAM of the fourth embodiment. FCRAM is pseudo SRAM of a clock asynchronous type. The other constructions are the same as the fourth embodiment.

FCRAM has chip enable terminals /CE1, CE2, a write enable terminal /WE, an output enable terminal /OE, an address terminal AD, a busy terminal BSY and a data terminal I/O0-7. FCRAM also has a memory cell (dynamic memory cell) of DRAM, and is one kind of pseudo SRAM having an interface of SRAM. FCRAM periodically executes a refresh operation within a chip without receiving a refresh command from the exterior, and holds data written to the memory cell. Therefore, FCRAM has a refresh control circuit REF for controlling the refresh operation in addition to the error correction circuit ECC, the control unit CNT3 and the flag area FLG. The constructions and functions of the error correction circuit ECC, the control unit CNT3 and the flag area FLG are the same as the above fourth embodiment.

The refresh control circuit REF has an unillustrated refresh timer for periodically generating a refresh request RREQ and an unillustrated page counter showing a refreshed page number. The operation of FCRAM at a time of receiving an access request from MPU is the same as the fourth embodiment. Namely, the operation of FCRAM is the same as the operation of the control unit CNT21 shown in FIG. 4 except for the operation of step S22.

Figure 14:
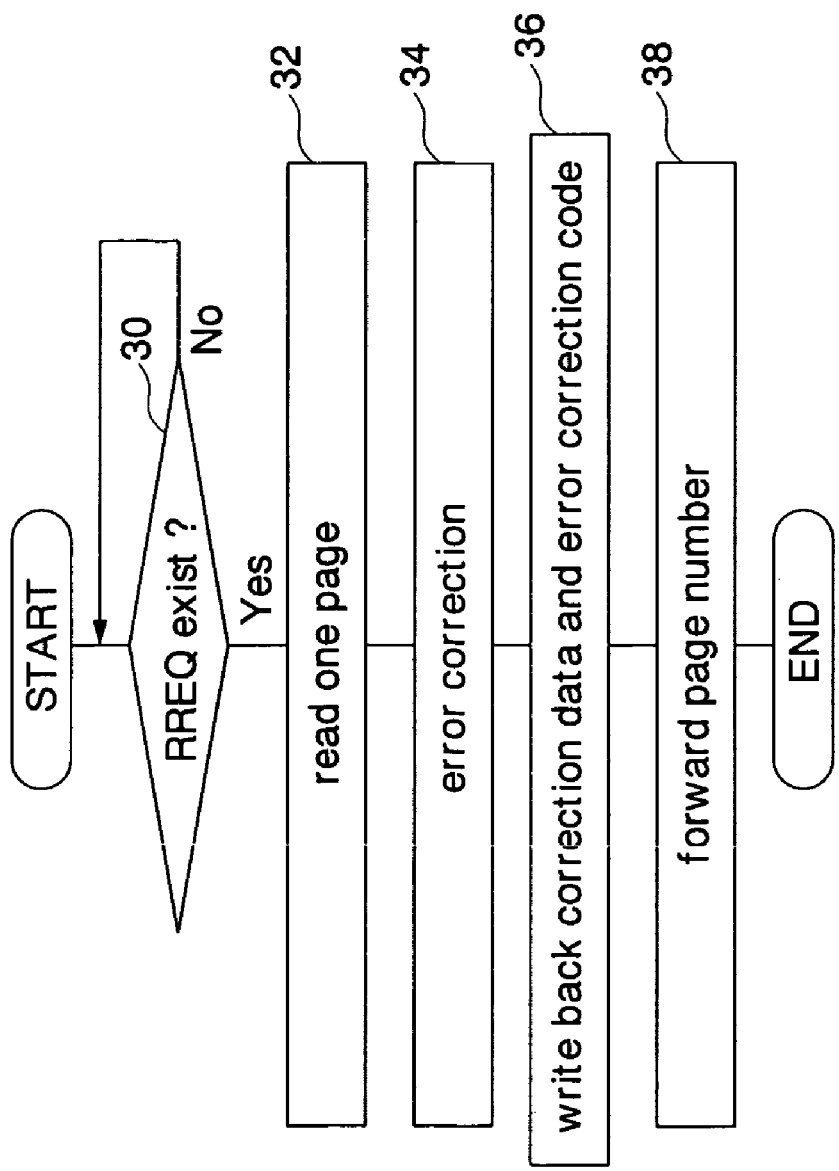
FIG. 14 is a flow chart showing the operations of a control unit, an error correction circuit and a refresh control circuit shown in FIG. 13.

FIG. 14 shows the operations of the control unit CNT3, the error correction circuit ECC and the refresh control circuit REF shown in FIG. 13. These operations are executed by respective circuits (hardware). The operations of steps S32, S34, S36 are the same as steps S10, S16, S18 shown in FIG. 4.

First, in step S30, the refresh control circuit REF waits for generation of a refresh request RREQ. When the refresh request RREQ is generated, processing proceeds to step S32. In step S32, the control unit CNT3 reads program data of a one-page amount from a memory cell array of FCRAM in response to the access request.

Next, in step S34, the error correction is executed by the error correction circuit ECC. In step S36, the control unit CNT3 (volatile memory control circuit) writes back the corrected program data and an error correction code newly generated to FCRAM. Namely, the error correcting operation and the write-back operation (refresh operation) of the one-page amount are executed in response to the refresh request RREQ. The written-back program data are corrected with respect to an error. Therefore, a failure generated by a software error, etc. within the memory cell array can be relieved. Thereafter, in step S38, an address counter forwards the page number by one.

As mentioned above, the sixth embodiment can obtain effects similar to those of the first and fourth embodiments. Further, the refresh operation and the error correcting operation can be simultaneously executed, and the scale of a control circuit can be reduced. Further, since a failure such as a software error, etc. can be relieved by the error correction, reliability of the volatile memory can be improved.

The above embodiments have described examples for applying the present invention to the mobile phone. However, for example, the present invention can be also applied to another portable equipment such as a digital camera, etc.

The above embodiments have described an example of forming the memory controller MCNT within SOC. However, the memory controller MCNT may be also formed of a single chip. In this case, for example, a multi chip module (memory system) may be also formed of memory controller MCNT, FLASH and SDRAM. Further, memory controller MCNT, FLASH and SDRAM may be also formed of one chip. Otherwise, FLASH and SDRAM may be also mounted into SOC together with memory controller MCNT.

The above embodiments have described an example of applying the present invention to the memory system having FLASH and SDRAM. However, the present invention is not limited to this example, but can be also applied to a memory system having a nonvolatile memory having a real data area and a storing area for the error correction code, and a volatile memory (one of SDRAM, DRAM, pseudo SRAM, FCRAM and SRAM). In this case, each semiconductor memory may be of a clock synchronous type and may be also of a clock asynchronous type.

The above third embodiment has described an example of writing the image data and its error correction code to FLASH at every photographing using the camera function. For example, the image data and the error correction code may be also held to SDRAM during power-on, and may be also transferred from SDRAM to FLASH at a power-off time. In this case, since the error correction code is generated at every photographing (every writing to SDRAM), it is not necessary to execute the error correction at the power-off. As a result, processing time at the power-off can be shortened.

The function of the transfer operation TRDF to FLASH at the power-off in the third embodiment may be also added to the above second and fourth to sixth embodiments. Further, in the first to third embodiments, the error correction circuit ECC may be also formed outside control units CNT21, 22, 23, or may be also formed outside memory controller MCNT.

The invention is not limited to the above embodiments and various modifications may be made without departing from the spirit and scope of the invention. Any improvement may be made in part or all of the components.

What is claimed is:

1. A memory system comprising:
a nonvolatile memory having a nonvolatile data area for storing data, and a nonvolatile additional area for storing an error correction code to correct an error in the data stored in said nonvolatile data area;
a volatile memory having a volatile data area and a volatile additional area for storing the error correction code corresponding to said nonvolatile data area and said nonvolatile additional area, respectively; and
a memory controller reading the data and the error correction code from said nonvolatile data area and said nonvolatile additional area without making error correction, and writing the read data and the error correction code to said volatile data area and said volatile additional area, respectively.

2. The memory system according to claim 1, further comprising a common data bus line connecting a data terminal of said nonvolatile memory and a data terminal of said volatile memory to each other, wherein said memory controller generates a nonvolatile read-access signal for making read access to said nonvolatile memory, or a volatile write-access signal for making write access to said volatile memory so as to transfer the data and the error correction code stored in said nonvolatile data area and said nonvolatile additional area to said volatile data area and said volatile additional area through said data bus line.

3. The memory system according to claim 2, wherein said memory controller starts the generation of said nonvolatile read-access signal or said volatile write-access signal in accordance with a power-on of the memory system.

4. The memory system according to claim 1, further comprising an error correction circuit correcting the data written to said volatile memory by using the error correction code after the data and the error correction code are written to said volatile memory.

5. The memory system according to claim 4, further comprising a flag area including a flag corresponding to each storing position of the data within said volatile data area and in which a flag corresponding to the data error-corrected by said error correction circuit is set, wherein said error correction circuit executes the error correction only to data corresponding to an unset flag.

6. The memory system according to claim 4, further comprising a volatile memory control circuit reading the data and the error correction code from said volatile memory to make the error correction, and writing back to said volatile memory the data corrected by said error correction circuit and the error correction code corresponding to the corrected data.

7. The memory system according to claim 6, wherein: said volatile memory control circuit reads the data and the error correction code from said volatile memory in response to an access request from an exterior of the memory system, and writes back to said volatile memory the error-corrected data and the error correction code corresponding to the error-corrected data; and said memory controller outputs the error-corrected data to the exterior of the memory system.

8. The memory system according to claim 7, wherein said volatile memory control circuit reads the data and the error correction code from said volatile memory during an idle state of said volatile memory, and writes back to said volatile memory the error-corrected data and the error correction code corresponding to the error-corrected data.

9. The memory system according to claim 1, further comprising a refresh control circuit periodically generating a refresh request, wherein said volatile memory has dynamic memory cells requiring a refresh operation; and said volatile memory control circuit reads the data and the error correction code from said volatile memory in response to said refresh request.

10. The memory system according to claim 1, wherein said memory controller generates a volatile read-access signal for making read access to said volatile memory or a nonvolatile write-access signal for making write access to said nonvolatile memory so as to transfer the data and the error correction code stored in said volatile data area and said volatile additional area to said nonvolatile data area and said nonvolatile additional area.

11. The memory system according to claim 10, wherein the data and the error correction code are transferred from said volatile memory to said nonvolatile memory before the memory system is powered off upon a power-off request.

12. The memory system according to claim 10, further comprising an error correction circuit correcting the data written to said volatile memory by using the error correction code after the data and the error correction code are written to said volatile memory, wherein said error correction circuit generates the error correction code of data supplied from the exterior of the memory system to said memory controller, and writes the generated error correction code to said volatile additional area and said volatile data area together with the supplied data, and the data and the error correction code are transferred from said volatile memory to said nonvolatile memory in synchronization with the data write to said volatile memory from the exterior of the memory system.

13. The memory system according to claim 1, wherein said error correction circuit is arranged within one of said memory controller and said volatile memory.

14. An operating method of a memory system the method comprising:
    reading data from a nonvolatile data area for storing data included in a nonvolatile memory and an error correction code from a nonvolatile additional area included in the nonvolatile memory for storing the error correction code to correct an error in the data stored in the nonvolatile data area without making error correction; and
    writing the read data to a volatile data area included in a volatile memory and the error correction code to a volatile additional area for storing the error correction code included in the volatile memory.

15. The operating method of the memory system according to claim 14, further comprising transferring the data and the error correction code from said nonvolatile memory to said volatile memory in accordance with a power-on of the memory system.

16. The operating method of the memory system according to claim 14, further comprising correcting the data written to said volatile memory by using the error correction code after the data and the error correction code are written to said volatile memory.

17. The operating method of the memory system according to claim 16, further comprising executing the error correction to data within said volatile data area only when the data is read from the volatile data area for the first time.

18. The operating method of the memory system according to claim 16, further comprising writing back to said volatile memory the corrected data and the error correction code corresponding to the corrected data.

19. The operating method of the memory system according to claim 18, further comprising:
    reading the data and the error correction code from said volatile memory in response to an access request from an exterior of the memory system, to correct an error in the data;
    writing back to said volatile memory the error-corrected data and the error correction code corresponding to the error-corrected data;
    and outputting the error-corrected data to the exterior of the memory system.

20. The operating method of the memory system according to claim 14, further comprising:
    generating a volatile read-access signal for making read access to said volatile memory, or a nonvolatile write-access signal for making write access to said nonvolatile memory; and
    transferring the data and the error correction code stored in said volatile data area and said volatile additional area to said nonvolatile data area and said nonvolatile additional area.

\* \* \* \* \*